US011929120B2

(12) United States Patent
Hayne et al.

(10) Patent No.: US 11,929,120 B2
(45) Date of Patent: Mar. 12, 2024

(54) ELECTRONIC MEMORY DEVICES

(71) Applicant: University of Lancaster, Lancaster (GB)

(72) Inventors: Manus Hayne, Lancaster (GB); Dominic Lane, Lancashire (GB)

(73) Assignee: University of Lancaster, Lancaster (GB)

( * ) Notice: Subject to any disclaimer, the term of this patent is extended or adjusted under 35 U.S.C. 154(b) by 243 days.

(21) Appl. No.: 17/614,813

(22) PCT Filed: May 28, 2020

(86) PCT No.: PCT/GB2020/051292
§ 371 (c)(1),
(2) Date: Nov. 29, 2021

(87) PCT Pub. No.: WO2020/240186
PCT Pub. Date: Dec. 3, 2020

(65) Prior Publication Data
US 2022/0230686 A1    Jul. 21, 2022

(30) Foreign Application Priority Data

May 29, 2019   (GB) ..................... 1907540

(51) Int. Cl.
*G11C 16/10*       (2006.01)
*G11C 16/04*       (2006.01)
*H01L 29/788*      (2006.01)
*H10B 43/35*       (2023.01)

(52) U.S. Cl.
CPC .......... *G11C 16/10* (2013.01); *G11C 16/0416* (2013.01); *H01L 29/788* (2013.01); *H10B 43/35* (2023.02)

(58) Field of Classification Search
CPC ....................................... H10B 43/35
See application file for complete search history.

(56) References Cited

U.S. PATENT DOCUMENTS

| 5,477,169 | A | * | 12/1995 | Shen ...................... G11C 5/142 326/55 |
| 5,986,939 | A | | 11/1999 | Yamada |
| 6,118,686 | A | | 9/2000 | Taira et al. |
| 6,207,978 | B1 | | 3/2001 | Fastow |

(Continued)

*Primary Examiner* — Douglas King
(74) *Attorney, Agent, or Firm* — Young Basile Hanlon & MacFarlane, P.C.

(57) ABSTRACT

A memory cell comprises a floating gate being disposed between a control gate and a channel, the floating gate being electrically isolated from the control gate and the channel by charge barriers and being configured to enable the selective passage of charge carriers into and out of the floating gate to provide occupancy states of the floating gate. The channel is arranged to provide a minimum threshold voltage to be applied between a control gate and the substrate for introducing charge carriers into the channel from the substrate to make the channel conductive, the minimum threshold voltage being dependent on the occupancy state of the floating gate, such that a read voltage may be applied between the control gate and the substrate that will provide a conductive channel for a first occupancy state of the floating gate and a non-conductive channel for a second occupancy state of the floating gate.

17 Claims, 4 Drawing Sheets

(56) References Cited

U.S. PATENT DOCUMENTS

| | | |
|---|---|---|
| 2005/0014923 A1 | 1/2005 | Watanabe et al. |
| 2008/0073641 A1* | 3/2008 | Cheng .................... G06F 1/04 |
| | | 438/237 |
| 2009/0184346 A1* | 7/2009 | Jain ....................... H01L 29/122 |
| | | 257/314 |
| 2011/0147708 A1* | 6/2011 | Radosavljevic .. H01L 29/66431 |
| | | 257/E21.403 |
| 2012/0155165 A1 | 6/2012 | Bimberg et al. |
| 2015/0235123 A1 | 8/2015 | Afzali-Ardakani et al. |
| 2016/0204202 A1 | 7/2016 | Jain |
| 2017/0352767 A1 | 12/2017 | Hayne |

* cited by examiner

_Figure 1_
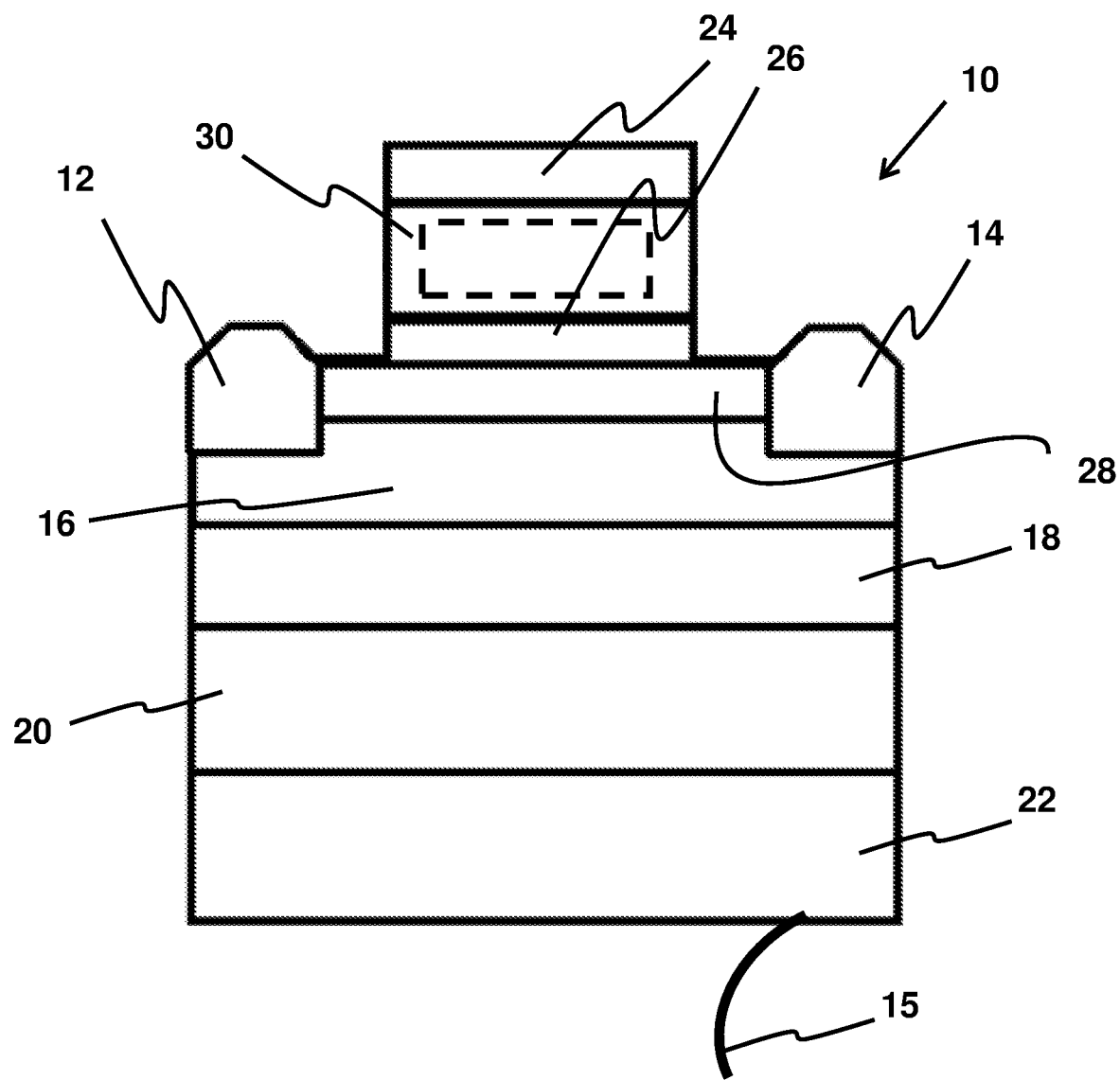

ELECTRONIC MEMORY DEVICES

CROSS-REFERENCE TO RELATED APPLICATION(S)

This application claims priority to United Kingdom Patent Application Serial No. GB 1907540.7, filed May 29, 2019, the entire disclosure of which is hereby incorporated by reference.

TECHNICAL FIELD

The present invention relates to electronic memory devices, and in particular to electronic memory devices that utilise floating gates to store charge and hence data.

BACKGROUND

In the modern era, society is becoming ever more dependent on access to, and the manipulation and storage of, increasingly vast amounts of data, at ever increasing speeds. Indeed, the ability to access large amounts of robustly stored data at a high speed is vital in many industries, as well as highly desirable for individuals when, for example, accessing the internet and the like. Access to information can promote freedom of choice, improve efficiency, drive innovation and economic development, and may overall lead to an improved quality of life.

Memory devices are typically semiconductor-based, integrated circuits for use by computers or other electronic devices. There are many different types of memory, including random-access memory (RAM), read only memory (ROM), non-volatile floating gate NOR/NAND flash memory, and dynamic random-access memory (DRAM).

Flash memory is a semiconductor device that utilises an electrically isolated floating gate within which charge is selectively stored. A conventional flash memory cell comprises a semiconductor substrate (usually silicon), which is doped to form separated source and drain terminals. A control gate terminal is also provided, with an electrically isolated floating gate disposed between the control gate and the substrate. A voltage applied to the control gate that is greater in magnitude than a threshold voltage enables current flow along a conductive channel, also known as an inversion layer, in the semiconductor substrate between the source and the drain terminals.

If charge is located within the floating gate, then the floating gate partially screens the control gate from the channel, thereby increasing the magnitude of the threshold voltage, ie the voltage at the control gate that is needed for current to flow through the channel. There are therefore at least two states of the device, a state in which charge is held in the floating gate and hence the device has a first threshold voltage, and a state in which no charge is held in the floating gate and hence the device has a second, lower threshold voltage. The state can be determined by applying an intermediate voltage to the control gate, ie a voltage that lies between the first and second threshold voltages, and sensing the current flow within the channel. The two states may be viewed as a bit, and thus the presence or absence of charge in the floating gate may provide a memory function for a device.

Due to the electrical isolation of the floating gate, which is typically achieved by placement of an oxide layer between the channel and the floating gate, and an oxide layer between the control gate and the floating gate, charge may be held within the floating gate for extremely long periods of time without the risk of charge being removed from the floating gate. Thus, flash memory is a non-volatile form of memory, which allows for robust storage of data.

Flash memory devices are configurable as enhancement mode devices or depletion mode devices. In enhancement mode devices, a conductive channel is induced by applying a gate voltage to the device, whereas a depletion mode device already has an existing conductive channel, which can be made non-conductive by applying a gate voltage. Hence, enhancement mode devices remain in an insulating state when no gate voltage is applied, whereas depletion mode devices are conductive when no gate voltage is applied and therefore have less useful application. Enhancement mode devices are preferred to enable single bit addressing in an array.

It is also preferable to maximise the enhancement of the channel conductivity in response to an applied gate voltage, so as to reduce the voltage required to operate the memory device. Conventionally, this is achieved by spatially doping of the channel laterally, so as to reduce the inherent conductivity of the channel, ie before a gate voltage is applied. However, spatial doping of the channel laterally is technically challenging.

There has now been devised a memory cell that overcomes or substantially mitigate the aforementioned and/or other disadvantages associated with the prior art.

SUMMARY

According to a first aspect of the invention, there is provided a memory cell for storing one or more bits of information, the memory cell comprising a semiconductor substrate on which is provided a source terminal, a drain terminal and a channel extending between the source and drain terminals, the memory cell further comprising a control gate and a floating gate, the floating gate being disposed between the control gate and the channel, and the floating gate being electrically isolated from the control gate and the channel by charge barriers and being configured to enable the selective passage of charge carriers into and out of the floating gate, in write and erase operations, to provide at least first and second occupancy states of the floating gate, the channel being arranged to provide a minimum threshold voltage to be applied between the control gate and the substrate for introducing charge carriers into the channel from the substrate to make the channel conductive, the minimum threshold voltage being dependent on the occupancy state of the floating gate, such that a read voltage may be applied between the control gate and the substrate that will provide a conductive channel for a first occupancy state of the floating gate and a non-conductive channel for a second occupancy state of the floating gate.

The memory cell according to the present invention is advantageous principally because the memory cell is arranged to provide a minimum threshold voltage to be applied between the control gate and the substrate for introducing charge carriers into the channel from the substrate to make the channel conductive. This enables the channel to be non-conductive at a zero applied voltage, without the need for lateral spatial doping, which therefore enables single bit addressing of the cell in an array.

The memory cell may have a heterojunction at the interface between the channel and the semiconductor substrate, in which the lowest energy level at which a charge carrier may reside in a conduction band of the channel has a higher energy than the valence band of the semiconductor substrate.

The channel may therefore be unoccupied by charge carriers in the absence of an applied electric field.

The channel may comprise a well. The well may comprise one or more internal states into which (and out of which) charge carriers can pass. The one or more internal states may be confined internal states. The one or more confined internal states may be discrete energy levels. The well may be formed by the appropriate selection of bulk semiconductor materials. For example, the well may be formed of indium gallium arsenide (InGaAs) having a deliberately higher gallium (Ga) composition.

The channel may comprise a quantum well. The quantum well may have discrete internal energy levels for accommodating charge carriers into the channel. The quantum well may be defined between a charge barrier and the semiconductor substrate. The quantum well of the channel may be formed by a layer of semiconductor defining the channel, which may be sufficiently thin that the energy levels for charge carriers are quantised.

The quantum well may be formed by the channel having offset conduction and/or valence bands to form heterojunctions at the interfaces between the channel and the charge barrier, and/or between the channel and the semiconductor substrate. The offset conduction and/or valence bands of the channel may be achieved by selecting different semiconductors for adjacent layers, thereby defining a quantum well in the conduction and/or valence bands. That is, the offset conduction and/or valence bands of the channel may be achieved by forming the channel with a different semiconductor to the semiconductor, or semiconductors, used to form the charge barrier and the semiconductor substrate. Where the charge barrier and/or the semiconductor substrate comprises more than one semiconductor, the offset conduction and/or valence bands of the channel may be achieved by forming the channel with a different semiconductor to the semiconductor used in the adjacent layer of the charge barrier and/or the semiconductor substrate.

The channel may therefore be formed by a narrow band gap semiconductor being disposed between two wide band gap semiconductors, thereby providing a heterojunction structure. That is, the channel may be formed by a narrow band gap semiconductor and the adjacent layer of the charge barrier and/or the semiconductor substrate may be formed by a wide band gap semiconductor. By "band gap" it is meant the energy gap between the valence and conduction bands of the semiconductor.

The semiconductor of the channel may be formed of any semiconductor that provides the required barrier potentials relative to the charge barrier and the semiconductor substrate, eg the required heterojunctions. In presently preferred embodiments, the semiconductors comprise III-V semiconductors, or alloys of III-V semiconductors. For example, the channel may comprise a compound where >50% of the group III atoms are In and >50% of the group V atoms are N or As, such as $In_xGa_{1-x}As$, where the substrate is GaSb.

The heterojunction between the channel and the charge barrier, and/or between the channel and the substrate, may be a type II heterojunction or a type III heterojunction. The heterojunction between the channel and the substrate is preferably a type-III heterojunction, ie a broken gap heterojunction, such that the band gap of the channel does not overlap with the band gap of the substrate, or at least not with the band gap of the adjacent layer of the semiconductor substrate. Nevertheless, the lowest internal energy level of the channel may have a higher energy than the valence band of the substrate at zero applied bias.

The channel may comprise one or more quantum dots, quantum wires or quantum wells. However, since conventional integrated devices are formed in layers, and fabrication techniques exist that provide heterojunctions with smooth interfaces and very few defects, the use of a quantum well provides less variability between cells.

The discrete energy levels of the channel may correspond to the one or more confined internal states into which (and out of which) charge carriers can pass. The lowest confined internal state of the channel may have a higher energy than the valence band energy of the semiconductor substrate at a zero applied bias. The lowest confined internal state of the channel may have a higher energy than the Fermi energy of the semiconductor substrate at a zero applied bias. The channel may therefore be free of charge carriers, ie unoccupied, at a zero applied bias, since charge carriers will not flow into the quantum well. That is, the quantum well, ie the channel, may be non-conductive, ie insulating at a zero applied bias.

The application of an electric field across the memory cell may modify the form of the channel, and/or the energy of charge carriers in the semiconductor substrate, such that the transmission coefficient for charge carriers in the semiconductor substrate is increased. The shape and/or magnitude of the electric potential barriers may be modified, eg the electric potential barriers may become inclined across the applied electric field. In particular, the increase or decrease in the height of the electric potential barriers may be proportional to its distance across the applied electric field. This application of an electric field is commonly called a lever voltage.

In response to the application of an electric field, ie an applied bias, the lowest confined internal state of the channel may have a lower energy than the valence band energy of at least a portion of the semiconductor substrate. Charged carriers may therefore flow from the semiconductor substrate into the channel in response to the application of an electric field. The channel may therefore become occupied, ie conductive, in response to the application of an electric field. The charged carriers may move from the semiconductor substrate into the channel by tunnelling.

At least one of the charge barriers may be a charge trapping barrier that enables the selective passage of charge carriers into the floating gate, in use, to modify the one or more bits of information stored by the memory cell. The charge barrier to one side of the floating gate may be a charge trapping barrier, and the charge barrier to the other side of the floating gate may be a charge blocking barrier that does not allow passage of charge carriers therethrough. In presently preferred embodiments, the charge trapping barrier is disposed between the channel and the floating gate, such that charge carriers introduced into the floating gate pass from the substrate, through the channel and into the floating gate on application of a write voltage.

The charge trapping barrier may be adapted to enable the selective passage of charge carriers into the floating gate, in use, to modify the one or more bits of information stored by the memory cell. The charge trapping barrier may be adapted to enable the selective passage of charge carriers into the floating gate in response to the application of an electric field across the memory cell. The charge trapping barrier may have any form that enables the selective passage of charge carriers into the floating gate. The charge trapping barrier may comprise at least one electric potential barrier that enables the selective passage of charge carriers into the floating gate, for example by controlling the energy of the charge carriers, and/or by controlling the shape and/or magnitude of the at least one electric potential barrier. The selective passage of charge carriers into the floating gate may be enabled by use of quantum mechanical effects. In particular, the energy of the charge carriers transmitted through the at least one electric potential barrier may be less than the height of the at least one electric potential barrier. The passage of charge carriers into the floating gate may be by quantum tunnelling, also known as wave-mechanical tunnelling, and hence the charge trapping barrier may be a quantum tunnelling barrier.

The charge trapping barrier may comprise at least one electric potential barrier that has a resonant energy, less than the height of the potential barrier, at which passage of charge carriers into the floating gate is enabled. The transmission coefficient for the charge carriers at the resonant energy may represent a peak, relative to the transmission coefficient at neighbouring energies. The transmission coefficient at the resonant energy may be many orders of magnitude greater than the transmission coefficient at neighbouring energies. The passage of charge carriers into the floating gate may be by resonant tunnelling, and hence the charge trapping barrier may be a resonant tunnelling barrier.

Resonant tunnelling enables fast write and erase speeds, such as less than 10 µs, less than 1 µs, less than 500 ns, or less than 100 ns, for example in the region of 1 ns, for each write and/or erase operation.

The charge trapping barrier may comprise at least one electric potential barrier that enables selective inter-band passage of charge carriers into the floating gate, eg between the conduction and the valence bands. The charge trapping barrier may therefore comprise a p-n junction, eg a heavily doped p-n junction. However, the charge trapping barrier preferably comprises at least one electric potential barrier that enables selective intra-band passage of charge carriers into the floating gate, eg within the conduction band or within the valence band. The charge trapping barrier may comprise at least one electric potential barrier in which energy states are quantised. This leads to a reduction in the density of states inside the barrier. As a result, only certain energy levels are allowed to be filled. The charge trapping barrier may comprise one or more quantum dots, quantum wires or quantum wells.

Since conventional integrated devices are formed in layers, and fabrication techniques exist that provide heterojunctions with smooth interfaces and very few defects, the use of quantum wells provides less variability between cells. The charge trapping barrier and the floating gate are preferably formed epitaxially, for example by molecular beam epitaxy (MBE), liquid phase epitaxy (LPE) or chemical vapour deposition (CVD), or the like.

The charge carriers may be electrons or holes. However, in presently preferred embodiments, the charge carriers are electrons, and the charge trapping barrier comprises at least one electric potential barrier that enables intra-band passage of electrons into the floating gate.

The charge trapping barrier may comprise two or more electric potential barriers, in a multiple barrier arrangement. For example, the charge trapping barrier may comprise two, three, four, five or more electric potential barriers. In presently preferred embodiments, the charge trapping barrier comprises two quantum wells, defining three potential barriers.

The charge trapping barrier may comprise one or more semiconductors. The charge trapping barrier may comprise one or more quantum wells. The one or more quantum wells may be formed by layers of one or more semiconductors, adjacent layers having offset conduction and/or valence bands to form heterojunctions at the interfaces between those adjacent layers. The offset conduction and/or valence bands of the layers of semiconductors may be achieved by selecting different semiconductors for adjacent layers, thereby defining one or more quantum wells in the conduction and/or valence bands.

Each quantum well may therefore be formed by a narrow band gap semiconductor being disposed between two wide band gap semiconductors, thereby providing a heterojunction structure. By "band gap" it is meant the energy gap between the valence and conduction bands of the semiconductor. The charge trapping barrier may therefore comprise a plurality of layers of two or more different semiconductors, which together define one or more quantum wells.

The plurality of layers of semiconductors in the charge trapping barrier may be formed of any semiconductors that provide the required barrier potentials, eg the required heterojunctions, including any resonant energies. The layers of semiconductors may alternate between two different semiconductors, eg between different elemental or compound semiconductors. Alternatively, the layers of semiconductors may comprise a semiconductor alloy, with different proportions of elements in adjacent, or alternate, layers.

The layers of the charge trapping barrier may have a conduction band offset and/or a thickness that provide a transmission coefficient peak at a resonant energy. The layers of the charge trapping barrier may have a conduction band offset of at least 1.0 eV, at least 2.0 eV, or at least 3.0 eV. The charge trapping barrier may have a thickness less than 50 nm, less than 30 nm or less than 10 nm. For example, for non-volatile memory, the charge trapping barrier may have a thickness in the range 10-20 nm and, for semi-volatile memory, the charge trapping barrier may have a thickness in the range 5-15 nm.

Since the memory cell modifies the one or more bits of information stored by the memory cell by enabling the selective passage of charge carriers into the floating gate, the charge trapping barrier may have a thickness that is sufficient to provide a desired resonant tunnelling barrier, without affecting the read operation sensitivity of the memory cell. The charge trapping barrier may have a thickness that is substantially the same as the thickness of the charge blocking barrier. Alternatively, the charge trapping barrier may have a thickness that is greater than the thickness of the charge blocking barrier. For example, the charge trapping barrier may have a thickness that is at least 30%, 50%, 100%, or 500% greater than the thickness of the charge blocking barrier.

The charge trapping barrier may comprise one or more confined internal states, into which (and out of which) charge carriers can pass, for example by quantum tunnelling. The confined internal states may be formed by any of quantum dots, quantum wires, or quantum wells. The charge trapping barrier may therefore be considered to be a 'hollow' barrier. In contrast, the charge blocking barrier may comprise no confined internal states, into which charge carriers can pass, such that charge carriers may not pass into the charge blocking barrier, for example by quantum tunnelling. The charge blocking barrier may therefore be considered to be a 'solid' barrier.

The semiconductors of the charge trapping barrier may be crystalline solids, eg crystalline inorganic solids. The semiconductors may have high electron mobility, for faster operation. The semiconductors may have a wide band gap, for operation at higher temperatures and with lower thermal noise.

In presently preferred embodiments, the semiconductors comprise III-V semiconductors, or alloys of III-V semiconductors. The layers of semiconductors may be substantially lattice matched in order to reduce defects, and hence reduce errors. The plurality of layers may be substantially lattice matched. The plurality of layers of semiconductors in the charge trapping barrier may have a maximum lattice mismatch of 5%, 1% or 0.5%.

In presently preferred embodiments, the channel is formed by indium gallium arsenide (InGaAs). The semiconductor substrate may be formed of any suitable semiconductor, including indium antimonide (InSb), aluminium indium antimonide (AlInSb), gallium antimonide (GaSb), gallium arsenide (GaAs) and silicon (Si). The semiconductor substrate may be the same, or a similar, material to the material of the floating gate. In presently preferred embodiments, the semiconductor substrate is defined by a layer of gallium antimonide (GaSb). Although not necessary, the source and drain terminals may be either n or p-doped.

The semiconductors of the charge trapping barrier may include any of boron nitride (BN), boron phosphide (BP), boron arsenide (BAs), aluminium nitride (AlN), aluminium phosphide (AlP), aluminium arsenide (AlAs), aluminium antimonide (AlSb), gallium nitride (GaN), gallium phosphide (GaP), gallium arsenide (GaAs), gallium antimonide (GaSb), indium nitride (InN), indium arsenide (InAs) and indium antimonide (InSb).

The semiconductors of the charge trapping barrier may include an alloy of semiconductor materials, and may include any of aluminium gallium arsenide (AlGaAs), indium gallium arsenide (InGaAs), indium gallium phosphide (InGaP), aluminium indium arsenide (AnnAs), aluminium indium antimonide (AlInSb), gallium arsenide nitride (GaAsN), gallium arsenide phosphide (GaAsP), gallium arsenide antimonide (GaAsSb), aluminium gallium nitride (AlGaN), aluminium gallium phosphide (AlGaP), indium gallium nitride (InGaN), indium arsenide antimonide (InAsSb), indium gallium antimonide (InGaSb), aluminium gallium indium phosphide (AlGaInP), aluminium gallium arsenide phosphide (AlGaAsP), indium gallium arsenide phosphide (InGaAsP), indium gallium arsenide antimonide (InGaAsSb), indium arsenide antimonide phosphide (InAsSbP), aluminium indium arsenide phosphide (AlInAsP), aluminium gallium arsenide nitride (AlGaAsN), indium gallium arsenide nitride (InGaAsN), indium aluminium arsenide nitride (InAlAsN), gallium arsenide antimonide nitride (GaAsSbN), gallium indium nitride arsenide antimonide (GaInNAsSb), and gallium indium arsenide antimonide phosphide (GaInAsSbP).

It will be appreciated that where an alloy of two or more elements is mentioned, the elements of the alloy may be present in any relative proportion.

The use of III-V semiconductors may provide high carrier mobility, for faster operation, and wide band gaps, for operation at higher temperatures and with lower thermal noise. The carrier mobility at room temperature may be at least 500 cm$^2$/Vs, at least 1,000 cm$^2$/Vs, at least 5,000 cm$^2$/Vs, at least 10,000 cm$^2$/Vs, or at least 20,000 cm$^2$/Vs. The semiconductors may comprise an alloy of semiconductor materials that have selected proportions of elements that provide the desired band gap and/or desired lattice constant for each layer.

One or more layers of semiconductor in the charge trapping barrier may comprise a narrow band gap semiconductor, such as indium arsenide (InAs) or gallium antimonide (GaSb). One or more layers of semiconductor in the charge trapping barrier may comprise a wide band gap semiconductor, such as aluminium gallium antimonide (AlGaSb) or aluminium gallium arsenide (AlGaAs). In a currently preferred embodiment, the charge trapping barrier may be formed of layers of indium arsenide (InAs) and aluminium gallium antimonide (AlGaSb). These III-V semiconductors have a very high conduction band offset, and are nearly lattice matched. The layers of the charge trapping barrier may have a conduction band offset of at least 1.0 eV, at least 2.0 eV, or at least 3.0 eV. The plurality of layers of semiconductors in the charge trapping barrier may have a maximum lattice mismatch of 5%, 1% or 0.5%.

The application of an electric field across the charge trapping barrier may modify the form of the one or more electric potential barriers, and/or the energy of charge carriers in the channel and/or the floating gate, such that the transmission coefficient for charge carriers in the channel or the floating gate, for each barrier electric potential, is increased. The shape and/or magnitude of the one or more electric potential barriers may be modified, eg the one or more electric potential barriers may become inclined across the applied electric field. In particular, the increase or decrease in the height of the one or more electric potential barriers may be proportional to its distance across the applied electric field. This application of an electric field is commonly called a lever voltage.

The charge trapping barrier may be modelled to provide a substantial alignment of resonant energies of the electric potential barriers when a pre-determined electric field is applied across the charge trapping barrier. The pre-determined electric field may be constant during a write or erase operation. Alternatively, the write or erase operation may be a multi-step process, requiring a plurality of different electric fields to be applied across the charge trapping barrier, sequentially, in order to enable passage of charge carriers through the charge trapping barrier.

The memory cell may have at least one write voltage that, when applied between the control gate and the source, causes flow of charge carriers, eg electrons, from the semiconductor substrate into the channel, through the charge trapping barrier, and into the floating gate. The number of charge carriers retained within the floating gate when the electric field is removed may be dependent on the form of the floating gate. The memory cell may have at least one erase voltage that, when applied between the control gate and the source, causes flow of charge carriers, eg electrons, from the floating gate, through the charge trapping barrier, and into the channel. Upon withdrawal of the at least one erase voltage, the charge carriers may flow from the channel into the semiconductor substrate, such that the channel becomes unoccupied, ie non-conductive.

The potential difference applied across the charge trapping barrier during a write operation, or an erase operation, may be substantially lower than conventional voltages necessary to transfer charge carriers into the floating gate. In particular, the potential difference may be less than 7V, less than 5V, or less than 3V. Thus, the charge carriers may have a low kinetic energy and, upon impact with the charge blocking barrier, may cause substantially less damage to the barrier than is known in the prior art. Thus, the number of times that data may be written to the memory cell may be increased relative to conventional flash memory. For example, the memory cell may allow around $10^6$, $10^{10}$, $10^{16}$, or more switching cycles in its lifetime.

The charge trapping barrier may be adapted to prevent charge carriers from entering the floating gate, in the absence of an applied write voltage. Similarly, the charge trapping barrier may be adapted to prevent charge carriers from leaving the floating gate, in the absence of an applied erase voltage. The charge trapping barrier may have a thickness and/or a height that substantially eliminates the probability of an electron tunnelling through the charge trapping barrier from the channel to the floating gate, in the absence of an applied write voltage, or from the floating gate to the channel, in the absence of an applied erase voltage. The charge trapping barrier may be adapted to prevent less than 1 electron per 10,000 years from leaving the floating gate in the absence of an applied electric field across the charge trapping barrier, or less than 1 electron per 1,000 years, or less than 1 electron per 100 years, or less than 1 electron per 10 years, or less than 1 electron per year.

The floating gate may be adapted to retain charge carriers, eg electrons, within its boundary. The floating gate may be electrically isolated from the control gate by a charge blocking barrier.

The floating gate may comprise an electric potential trap in which energy states are quantised, between the charge trapping barrier and the charge blocking barrier. This leads to a reduction in the density of states inside the floating gate. As a result, only certain energy levels are allowed to be filled. The floating gate may comprise one or more quantum dots, quantum wires or quantum wells. However, since conventional integrated devices are formed in layers, and fabrication techniques exist that provide heterojunctions with smooth interfaces and very few defects, the use of a quantum well provides less variability between cells.

The floating gate may comprise a quantum well, defined between the charge trapping barrier and the charge blocking barrier. In particular, the charge trapping barrier and the charge blocking barrier may define the walls of the quantum well of the floating gate.

The quantum well of the floating gate may be formed by a layer of semiconductor defining the floating gate, and a layer of semiconductor on each side of the floating gate. The layers of semiconductor on each side of the floating gate may define at least part of the charge trapping barrier and the charge blocking barrier. The adjacent layers may have offset conduction and/or valence bands to form heterojunctions at the interface between those adjacent layers, thereby defining the floating gate. The offset conduction and/or valence bands of the layers of semiconductors may be achieved by selecting different semiconductors for adjacent layers, thereby defining quantum wells in the conduction and/or valence bands.

The quantum well of the floating gate may therefore be formed by a narrow band gap semiconductor being disposed between two wide band gap semiconductors, thereby providing a heterojunction structure. The charge blocking barrier may comprise an electric potential barrier that is substantially the same size as the electric potential barrier of the charge trapping barrier adjacent to the floating gate. Alternatively, the charge blocking barrier may comprise an electric potential barrier that is greater than the electric potential barrier of the charge trapping barrier adjacent to the floating gate. The layer of material defining that part of the charge blocking barrier that is adjacent to the floating gate may therefore be a wider band gap material than the layer of semiconductor defining that part of the charge trapping barrier that is adjacent to the floating gate.

The layers of the floating gate and the charge trapping barrier may have a conduction band offset of at least 1.0 eV, at least 2.0 eV, or at least 3.0 eV. The layers of the floating gate and the charge blocking barrier may have a conduction band offset of at least 1 eV, at least 2 eV, or at least 3 eV.

The material defining the floating gate may be a similar material, or indeed the same material, as the material that provides the lower potential regions of the charge trapping barrier.

The material defining the floating gate may therefore be a semiconductor, for example one of the suitable semiconductors discussed above in relation to the charge trapping barrier. The floating gate is most preferably formed of a III-V semiconductor material. In presently preferred embodiments, the floating gate is defined by a layer of indium arsenide (InAs) or indium gallium arsenide antimonide (InGaAsSb).

The charge blocking barrier may be adapted to prevent charge carriers, eg electrons, passing between the floating gate and the control gate. Alternatively, where charge carriers are able to pass between the floating gate and the control gate, this passage of charge carriers does not modify the one or more bits of information stored by the memory cell.

The charge blocking barrier may be an electric potential barrier with a height that is substantially equal to the electric potential barriers of the charge trapping barrier. Alternatively, the charge blocking barrier may be an electric potential barrier with a height that is significantly greater than the electric potential barriers of the charge trapping barrier. The charge blocking barrier may have a thickness of less than 20 nm, less than 10 nm, or less than 5 nm. For example, for non-volatile memory, the charge blocking barrier may have a thickness in the range 10-20 nm and, for semi-volatile memory, the charge blocking barrier may have a thickness in the range 5-15 nm.

The charge blocking barrier may be formed of an insulator, or a semiconductor material that defines a suitably large electric potential barrier relative to the floating gate. The charge blocking barrier may be formed of a semiconductor material. The charge blocking barrier may be formed of a III-V semiconductor material, for example aluminium antimonide (AlSb), or from a suitable dielectric, for example an oxide, such as silicon dioxide ($SiO_2$) or aluminium oxide ($Al_2O_3$).

The charge blocking barrier may have a thickness that is such that the floating gate and the channel are in close proximity.

Although there are advantages to the use of a III-V semiconductor for the semiconductor substrate, III-V semiconductors may be expensive to source and/or fabricate. In presently preferred embodiments, the semiconductor substrate is formed on an additional base substrate of one or more other semiconductors, for example a layered base substrate. Indeed, if a layer of the base substrate were silicon, this offers advantages in terms of integration with convention silicon devices. A particularly advantageous base substrate, where the semiconductor substrate is gallium antimonide (GaSb) is a layer of gallium arsenide (GaAs), and a layer of silicon. However, other combinations of III-V semiconductors may be suitable.

The layers of material that define one or more of the charge trapping barrier, the floating gate, the charge blocking barrier, the channel, and the semiconductor substrate, may be substantially lattice matched. Thus the heterostructure of the active device region of the memory cell may be substantially defect free, and may ensure high reliability of the cell. The lattice mismatch may be less than 5%, less than 3%, or less than 1%.

The memory cell may be formed by any conventional means of semiconductor structure manufacture. However, at least the charge trapping barrier and the floating gate are preferably formed epitaxially, for example by molecular beam epitaxy (MBE), liquid phase epitaxy (LPE), or chemical vapour deposition (CVD), or the like.

Each terminal may be connectable to other parts of a device, eg another part of an integrated circuit. The memory cell may have a base gate terminal, in addition to the control gate, source and drain terminals, which is typical in MOSFET-type devices. The base gate terminal may be connected to the source terminal or the drain terminal, for example.

The memory cell may form part of an array of memory cells, configured to store many bits of information within a memory device. Hence, according to a further aspect of the invention, there is provided a memory device comprising a plurality of memory cells as described above, configured to provide write, read and erase operations. The memory device may be either a NOR type memory device, where the memory cells are connected in parallel, or a NAND type memory device, where the memory cells are connected in series.

The memory cell may achieve a State "0" when there are charge carriers stored in the floating gate, and a State "1" when there are less charge carriers, or no charge carriers, stored in the floating gate. In order to read the state of the memory cell, a read voltage ($V_{read}$) may be applied to the control gate, relative to either the source terminal or the base gate terminal, the read voltage ($V_{read}$) being between a first threshold voltage ($V_{th}$) of the memory cell in State "0", and a second, lower, threshold voltage ($V_{th}$) of the memory cell in State "1". The read voltage ($V_{read}$) may be applied between the control gate and the source terminal, eg with the base gate terminal connected to the source terminal. However, in order to reduce the voltage between the control gate and the floating gate, and hence reduce the risk of charge carriers being transferred between them, the read voltage ($V_{read}$) may be applied between the control gate and the base gate terminal, with the base gate terminal not connected to the source terminal.

The applied read voltage ($V_{read}$) may result in a first current at the source terminal and/or the drain terminal when the memory cell is in State "1", and either a second, lower current, or no or negligible current, when the memory cell is in State "0". The device may therefore include an arrangement for sensing or measuring the current flow between the source and the drain terminals of the memory cell.

In the write operation, electrons may be pushed into the floating gate by applying a write voltage ($V_{write}$) to the control gate, relative to either the source terminal or the base gate terminal. The write voltage ($V_{write}$) may be applied between the control gate and the source terminal, eg with the base gate terminal shorted to the source terminal, which may enable a lower write voltage.

In the erase operation, the electrons may be ejected out of floating gate by applying an erase voltage ($V_{erase}$) to the control gate, relative to either the source terminal or the base gate terminal. The erase voltage ($V_{erase}$) may be applied between the control gate and the source terminal, eg with the base gate terminal connected to the source terminal, which may enable a lower erase voltage.

During retention, the charge may be retained in the floating gate. In presently preferred embodiments, no voltage is applied to the control gate, relative to the source terminal, during retention.

According to a further aspect of the invention, there is provided a memory device comprising a plurality of the memory cells as defined above.

According to a further aspect of the invention, there is provided a memory device comprising a plurality of memory cells for storing one or more bits of information, each memory cell comprising a semiconductor substrate on which is provided a source terminal, a drain terminal and a channel extending between the source and drain terminals, the memory cell further comprising a control gate and a floating gate, the floating gate being disposed between the control gate and the channel, and the floating gate being electrically isolated from the control gate and the channel by charge barriers and being configured to enable the selective passage of charge carriers into and out of the floating gate by resonant tunnelling, in write and erase operations, to provide at least first and second occupancy states of the floating gate, such that a read voltage may be applied between the control gate and the substrate that will provide a conductive channel for a first occupancy state of the floating gate and a non-conductive channel for a second occupancy state of the floating gate.

The channel may comprise a quantum well having discrete internal energy levels for accommodating charge carriers in the channel that are arranged to provide a minimum threshold voltage to be applied between the control gate and the substrate for introducing charge carriers into the channel from the substrate to make the channel conductive.

The memory cells may be adapted such that their channels are conductive only upon application of an electric field across the memory cells. The memory device may be configured to provide write, read and erase operations in respect of each of the plurality of memory cells. The memory device may comprise means for sensing or measuring the current flow through the channel of each of the plurality of memory cells. The memory device may further comprise means for applying a read voltage to the control gate of each memory cell.

The plurality of memory cells may be arranged in an array. The array may comprise a plurality of columns and a plurality of rows. Each memory cell within a row may be electrically connected. Each memory cell within a column may be electrically connected. The memory device may comprise at least one first electrical contact arranged to provide a voltage to the control gate of each memory cell in a column of the array. The memory device may comprise at least one second electrical contact arranged to provide a voltage to the substrate of each memory cell in a row of the array, through at least one of the source, drain or base gate terminals. The other two of the source, drain and base gate terminals may be connected to ground.

In use, the first electrical contact may apply a first portion of a required voltage to a desired column within the array, and the second electrical contact may apply a second portion of the required voltage to a desired row within the array, such that a target cell within the array receives the full required voltage. The required voltage may be any of the read voltage, write voltage and erase voltage previously described. The first portion of a required voltage may be at least 10%, 20%, 30%, 40%, or 50% of the total required voltage. The second portion of a required voltage may be at least 50%, 60%, 70%, 80% or 90% of the total required voltage.

This may be advantageous in that only the target memory cell receives the total voltage required to read, write to, or erase from that memory cell, whilst the remaining memory cells in the same column or row receive only a portion of the total required voltage and are therefore unaffected.

The memory cell may be non-volatile. The memory cell may store the one or more bits of information without requiring power. The storage time of the memory cell may be at least 10,000 years, thereby allowing a memory chip to store data for at least 10 years. Indeed, storage times of at least 100,000 years, or at least 1,000,000 years, may be achievable.

Whilst the present application focuses mainly on non-volatile memory cells, it is also recognised that the principles may be more widely applied to form a semi-volatile memory cell. Such a semi-volatile memory cell may be suitable for use as a DRAM type memory. Where the memory cell is semi-volatile, the storage time of the memory cell may be at least 1 hour, at least 1 day, a least 1 week, or at least one year. This may provide significant advantages over current DRAM type memory, where capacitors need to be refreshed approximately every 60 milliseconds.

BRIEF DESCRIPTION OF THE DRAWINGS

FIG. 1 is a schematic cross-sectional view of a memory cell according to the invention;

DETAILED DESCRIPTION

Figure 2:
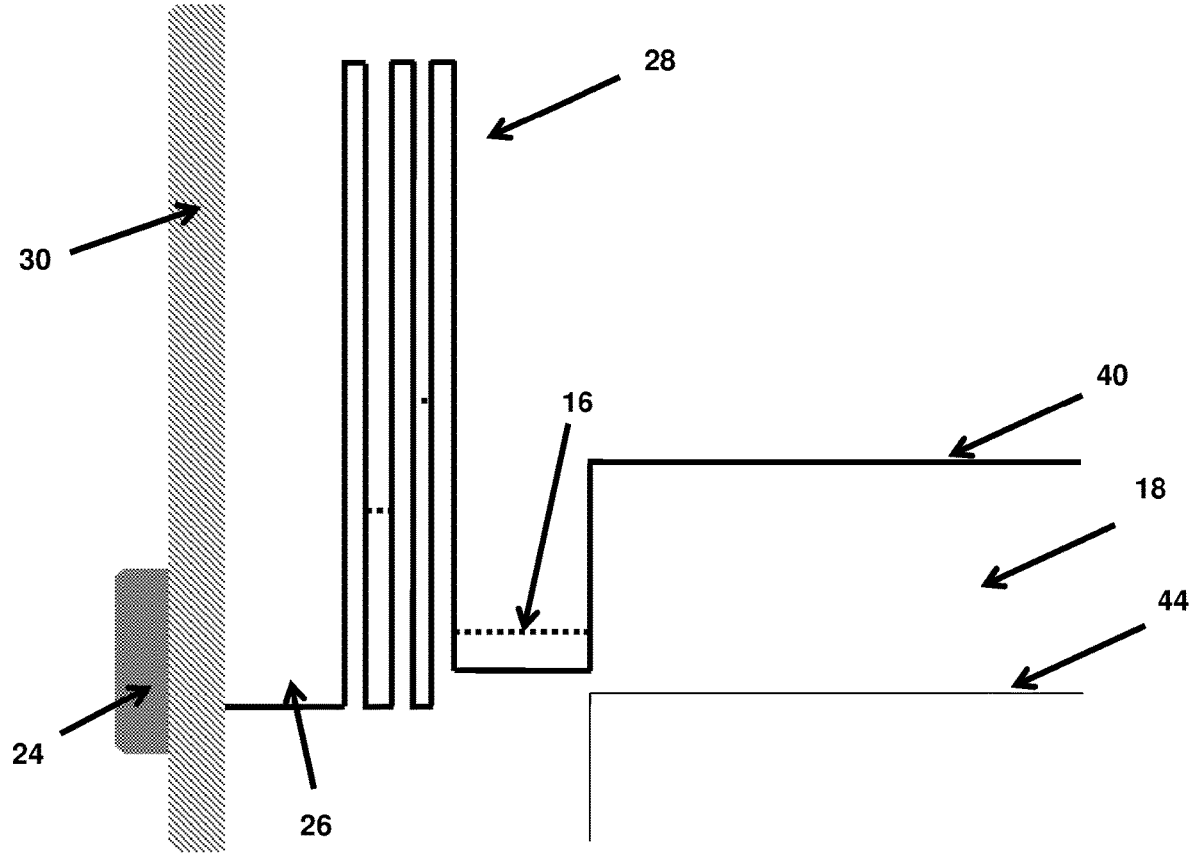
FIG. 2 is a schematic conduction band energy level diagram of a memory cell according to the invention.

FIG. 1 illustrates a schematic cross section of a memory cell according to the invention, which is generally designated 10. The memory cell 10 comprises source and drain terminals 12,14, a channel 16 between the source and drain terminals 12,14, a base gate terminal 15 at the base of the semiconductor substrate 18, and a control gate 24 for inducing a change in the conductivity of the channel 16 in the semiconductor substrate 18 between the source and drain terminals 12,14. The memory cell also comprises a floating gate 26 disposed between the control gate 24 and the semiconductor substrate 18.

The floating gate 26 is electrically isolated from the control gate 24 by a charge blocking barrier 30, and the floating gate 26 is electrically isolated from the semiconductor substrate 18, and therefore the channel 16 in the semiconductor substrate 18, by a charge trapping barrier 28. The charge trapping barrier 28 is adapted to enable the selective passage of charge carriers between the floating gate 26 and the channel 16 in the semiconductor substrate 18, in use, to modify the one or more bits of information stored by the memory cell 10. In contrast, the charge blocking barrier 30 prevents the passage of charge carriers between the control gate 24 and the floating gate 26.

The channel 16 differs from that of a conventional memory cell in that the channel 16 is formed from a different material grown onto the semiconductor substrate 18 material. The channel 16 is grown upon the semiconductor substrate 18 epitaxially, for example by molecular beam epitaxy (MBE) or any other appropriate process. The semiconductor substrate 18 is formed of gallium antimonide (GaSb) and is disposed upon a base structure 20, 22 that enables the use of lower cost materials, and may facilitate integration into silicon-based devices. In particular, the uppermost base layer 20 of the base structure 20,22 is formed of gallium arsenide (GaAs), and the semiconductor substrate 18 is disposed upon the uppermost base layer 20 using the interface-misfit method (IMF). The uppermost base layer 20 is disposed upon the lowermost base layer 22, which is formed of silicon (Si) or of germanium (Ge) on silicon.

Alternatively, the semiconductor substrate 18 may be disposed on the uppermost base layer 20 of GaAs with a greater thickness, ie with no additional lowermost base layer. This may be advantageous since GaAs is a common compound semiconductor and is widely available.

Alternatively, the semiconductor substrate 18 may be disposed on an uppermost base layer 20 of Si with a greater thickness, ie with no additional lowermost base layer. This may be advantageous since Si is the most common semiconductor and is widely available. In such an implementation it would be advantageous to mitigate the potentially detrimental effect of the lattice mismatch of the substrate 18 and the uppermost base layer 20 with, for example, the inclusion of a strain-relieving mechanism. One example of such a mechanism is the inclusion of one or more atomic monolayers provided between the substrate 18 and the uppermost base layer 20, although it will be appreciated that this may be provided by any other known suitable means. The one or more atomic monolayers may comprise AlSb. The one or more atomic monolayers may comprise 10, 15, or 20 atomic monolayers.

Alternatively, the semiconductor substrate 18 may have a greater thickness and be formed from only gallium antimonide (GaSb). The memory cell 10 may be more expensive to manufacture in this form, but does not require any lattice matching with a base structure.

The charge trapping barrier 28 is formed of alternating layers of indium arsenide (InAs) and aluminium antimonide (AlSb) to generate two narrow quantum wells (ie three resonant tunnelling barriers), and is disposed upon an upper surface of the channel 16. The layers of the charge trapping barrier 28 are substantially lattice matched and have a large conduction band offset.

The floating gate 26 is disposed on an upper surface of the charge trapping barrier 28, and is formed by indium arsenide (InAs), the thickness of which is not critical, but may typically be in the region of 10 to 50 nm. The floating gate 26 is an electrically isolated quantum well, defined between the charge trapping barrier 28 and the charge blocking barrier 30, which is suitable for retaining a finite number of charge carriers in quantised energy levels.

Situated above the floating gate 26 is the charge blocking barrier 30. The charge blocking barrier 30 may be formed by 15 nm of aluminium antimonide (AlSb). Such a charge blocking barrier 30 has a thickness that is substantially equal to the thickness of the charge trapping barrier 28. Furthermore, the charge blocking barrier 30 has an electric potential barrier that is substantially equal to the electric potential barrier of the charge trapping barrier 28. Alternatively, since the charge blocking barrier should have insulating properties and is disposed above the semiconductor layers of the device it may be formed by a dielectric layer, for example an oxide, such as silicon dioxide ($SiO_2$) or aluminium oxide ($Al_2O_3$). Aluminium oxide is a convenient choice as aluminium is often readily available in compound semiconductor epitaxy systems such as molecular beam epitaxy and vapour phase epitaxy, so may be deposited in situ in the epitaxy reactor as a thin layer that will naturally oxidise ex situ, protecting the semiconductor layers underneath. In practice, an additional dielectric layer may be disposed ex situ so as to ensure the protection of the semiconductor layers The control gate 24 is formed of any suitable conductive material, such as a metal, for example gold.

The charge trapping barrier 28, the floating gate 26, and the charge blocking barrier 30, may be formed on the semiconductor substrate 18, ie onto the channel 16, by any suitable method, for example by molecular beam epitaxy (MBE), liquid phase epitaxy (LPE), or chemical vapour deposition (CVD), or the like.

After growth, the cell 10 is processed using standard semiconductor lithography techniques. Contacts are made to the source 12, drain 14, control gate 24 and base gate terminal 15 for the application of voltages and to allow the passage of current through the cell 10.

As shown in FIG. 2, the charge trapping barrier 28 defines electric potential barriers, which define a series of quantum wells that enable resonant tunnelling. The quantum wells are of different sizes, and are specifically formed by layers of 1.8 nm of AlSb, 2.4 nm of InAs, 1.2 nm of AlSb, 3.0 nm of InAs, 1.8 nm of AlSb. The electric potential barriers of the charge trapping barrier 28 have resonant energies, indicated by the dotted lines in FIG. 3, which enable the passage of charge carriers at, or substantially at, those energies through the respective electric potential barrier.

The charge trapping barrier 28 is modelled to ensure that the resonant energies are not aligned when no voltage is applied to the memory cell 10, but to provide a substantial alignment of resonant energies of the electric potential barriers when a pre-determined electric field is applied across the charge trapping barrier 28, allowing charge carriers to pass from the channel 16 into the floating gate 26, or vice versa.

When the cell 10 is not being used, no voltages should be applied. In this state the large potential barrier 30 between the floating gate 26 and the control gate 24 prevents the passage of charge between them. Similarly, no charge may flow between the floating gate 26 and the channel 16 because the energies of the confined states in the two quantum wells in the charge trapping barrier 28 are high and are not coincident with each other.

In order to write to the cell 10, the drain 14 is shorted to the base gate terminal 15 contact (ground), and a voltage of about +2.5 V is applied between the control gate 24 and the source 12. This will align the lowest quantum confined states in the two quantum wells that form part of the charge trapping barrier 28, such that electrons may rapidly pass into the floating gate 26 by the process of resonant tunnelling.

In order to erase from the cell 10, the drain 14 is shorted to the base gate terminal 15 (ground), and a voltage of about −2.5 V is applied between the control gate 24 and the source 12. This will align the lowest confined states in the floating gate 26 and the adjacent quantum wells in the charge trapping barrier 28 such that electrons may rapidly pass out of the floating gate 26 by the process of resonant tunnelling into (a higher energy state of) the other quantum well in the charge trapping barrier 30 and thereafter into the channel 16.

In order to read the cell 10 without applying a significant voltage between the control gate 24 and the floating gate 26, which are in close proximity, and thereby avoiding the flow of charge between them, the source should not be shorted to the base gate terminal 15. Instead, a voltage of about +0.5 V should be applied between the control gate 24 and the base gate terminal 15, such that in the absence of charge in the floating gate 26 the carriers in the semiconductor substrate 18 will be driven into the channel 16 making it more conductive and giving a reading of '1', and that in the presence of charge in the floating gate 26, the conductivity of the channel 16 will be substantially less enhanced giving a reading of '0'.

This is generally in line with the operation of conventional flash memory. However, unlike conventional flash memory, in the memory cell 10 according to the present invention, the channel 16 in the semiconductor substrate 18 comprises a quantum well that is naturally non-conductive. This is illustrated in greater detail in FIG. 3.

Figure 3:
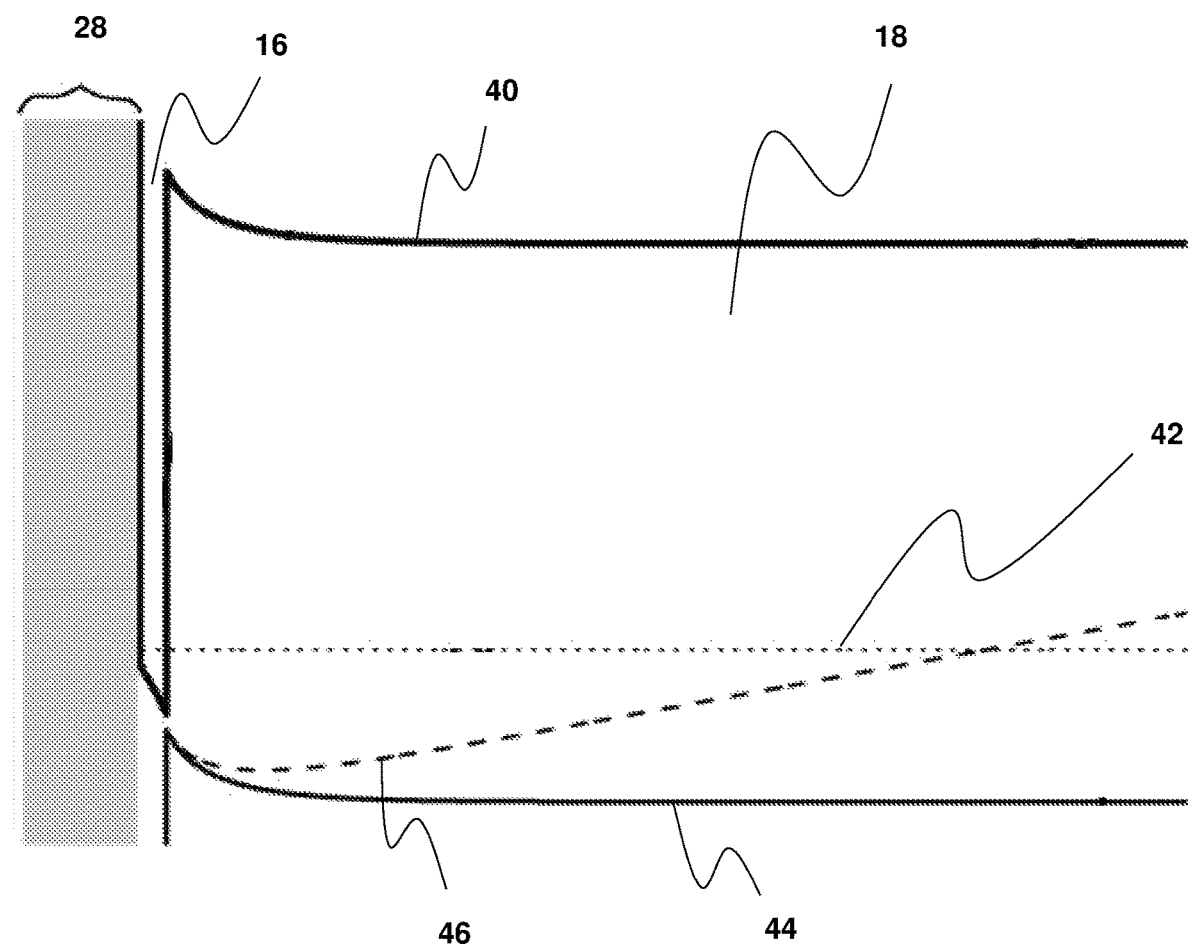
FIG. 3 is a schematic conduction and valence band energy level diagram at the channel-substrate interface of a memory cell according to the invention.

In FIG. 3, it can be seen that the channel 16 comprises a quantum well defined by the electric potential barriers of the adjacent semiconductor substrate 18 and the adjacent charge trapping barrier 28. The electric potential barrier of the adjacent semiconductor substrate 18 is the conduction band 40 of the semiconductor substrate 18. The quantum well is particularly narrow, eg 15 nm, such that quantum effects dictate that the quantum well has quantized energy levels, otherwise known as confined energy levels, the lowest of which (ie the ground state energy level) is indicated by the dotted line 42. These confined energy levels represent the energy levels charge carriers must occupy whilst in the quantum well.

At a zero applied bias, it can be seen that the valence band 44 of the semiconductor substrate 18 has a lower energy than the quantized energy state 42 of the channel 16. Thus, in normal conditions, charge carriers will not move from the semiconductor substrate 18 into the channel 16, resulting in the channel 16 being unoccupied, ie insulating or non-conductive.

However, by applying a bias of, for example, 0.3V, between the control gate 24 and the base gate terminal 15, it can be seen that the valence band energy 46 of the semiconductor substrate 18 is shifted. The valence band energy 46 is shifted such that a portion of the valence band 46 is raised enough to exceed the ground-state energy level 42 of the quantum well.

In response to the applied bias, since a portion of the valence band 46 exceeds the ground-state energy 42 of the quantum well, the charge carriers in the valence band 46 move into the quantum well, ie the channel 16 becomes occupied, and therefore conducting.

The memory cell 10 has a write voltage that, when applied between the control gate 24 and the source 12, causes flow of electrons into the channel 16, and then from the channel 16, through the charge trapping barrier 28, into the floating gate 26. The electrons move through the charge trapping barrier 28 in a conventional manner, ie by resonant tunnelling, in order to write to the floating gate 26. The number of electrons retained within the floating gate 26 when the electric field is removed may be dependent on the form of the floating gate 26. The memory cell 10 also has an erase voltage that, when applied between the control gate 24 and the source 12, causes flow of electrons from the floating gate 26, through the charge trapping barrier 28, into the channel 16, and then out of the channel 16 back into the semiconductor substrate 18. Similarly, the electrons move the opposite way through the charge trapping barrier 28 in a conventional manner, ie by resonant tunnelling, in order to erase from the floating gate 26. During storage, the electrons are retained in the floating gate 26, and no bias needs to be applied on the control gate 24, in order for the memory cell to store the one or more bits of information provided by the presence or otherwise of electrons in the floating gate 26.

In response to a lesser applied bias, the valence band energy of the semiconductor substrate 18 would be shifted less, ie not enough for a portion to exceed the ground-state energy level 42 of the quantum well, and the channel 16 would remain insulating. In response to a greater applied bias, the valence band would be shifted more, ie enough for a larger portion of the valence band to be raised enough to exceed the ground-state energy level 42 of the quantum well. It will therefore be understood that the density of charge carriers in the channel 16, and hence the conductivity of the channel 16, depends on the bias applied between the control gate and the base gate terminal.

There is therefore a threshold voltage which, when applied between the control gate 24 and the base terminal gate 15 or between the control gate 24 and the source terminal 12, raises the valence band of the adjacent semiconductor substrate material 18 just enough to exceed the ground-state energy 42 of the quantum well, and thus transition the channel 16 between an insulating state and a conducting state.

The threshold voltage ($V_{th}$) of the memory cell 10 may therefore be defined as the value of the control gate-source voltage, or the control gate-base gate terminal voltage, when the conductivity of the conducting channel connecting the source 12 and drain 14 of the memory cell 10 switches between a depleted state, ie depleted of charge and therefore insulating and only allowing inherent leakage current, and a conducting state. The memory cell 10 is arranged to provide a change to the threshold voltage when one or more charge carriers, eg electrons, are retained by the floating gate 26.

The memory cell 10 achieves a State "0" when there are charge carriers stored in the floating gate 26, and a State "1" when there are less charge carriers, or no charge carriers, stored in the floating gate 26. In order to read the state of the memory cell 10, a read voltage ($V_{read}$) is applied to the control gate 24, the read voltage ($V_{read}$) being between the first threshold voltage ($V_{th}$) of the memory cell 10 in State "0", and the second, lower, threshold voltage ($V_{th}$) of the memory cell 10 in State "1". The applied read voltage ($V_{read}$) results in a first current at the source 12 and/or drain 14 when the memory cell 10 is in State "1", and no or negligible current when the memory cell 10 is in State "0". The device into which the memory cell is incorporated therefore includes an arrangement for sensing or measuring the current flow between the source and the drain of the memory cell.

Although the memory cell has been described above as having a channel that comprises a quantum well, it is also foreseen that the channel could instead comprise a semiconductor layer formed of a semiconductor different to that of the semiconductor substrate, provided the conduction band of the channel layer is above the valence band of the semiconductor substrate, and by applying a voltage, at least a portion of the valence band of the semiconductor substrate is raised above the conduction band of the channel.

The similarities between the memory cell 10 according to the present invention and Flash memory cells readily allows the memory cell 10 disclosed herein to be implemented in Flash architectures, such as NAND type architectures for example, in which a plurality of memory cells are connected in series in large strings.

The inventor(s) has also discovered that the memory cells disclosed herein may be implemented in an architecture for active memory, ie RAM, which allows fast access to an individual memory cell within an array of memory cells, at the request of a user.

Figure 4:
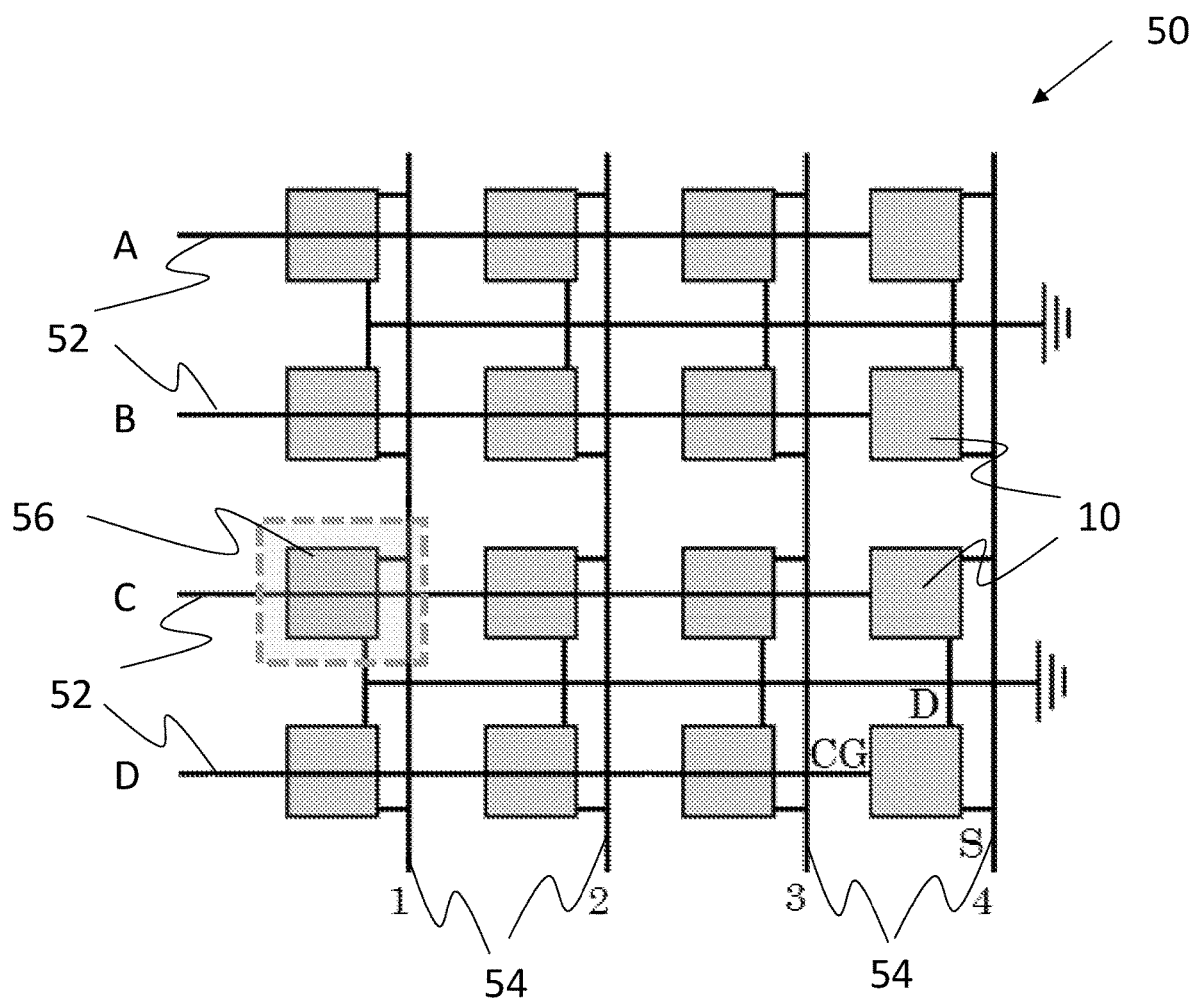
FIG. 4 is a schematic representation of an array of memory cells according to the invention.

Such an architecture is possible by implementing the memory cells described above in an architecture as illustrated in FIG. 4. FIG. 4 illustrates a section of a memory device 50 having a plurality of memory cells 10 arranged in an array. The array comprises rows of memory cells 10 electrically connected by wordlines 52A, 52B, 52C, 52D and columns of memory cells 10 electrically connected by bitlines 54-1, 54-2, 54-3, 54-4.

It is noteworthy in FIG. 4 that the drain terminals of the memory cells 10 are connected in pairs and also connected, in common, to the base gate terminals of all of the cells in the array 50.

Due to the nature of the resonant tunnelling barrier 28 of the memory cells 10, the current peaks for the write and erase processes are particularly sharp. That is, the voltage required to write or erase to/from the memory cells 10 can be quantified quite specifically. This allows the required voltage to be applied to the memory device 10 via two half-voltages.

In the example of FIG. 4, a first half-voltage is applied to the target memory cell 56 via wordline 52C, and a second half-voltage is applied to the target memory cell 56 via bitline 54-1. This allows the target memory cell 56 to receive the full voltage required to write/erase to/from the floating gate 26 of the memory cell 56, whilst ensuring that none of the other memory cells 10 along wordline 52C or bitline 54-1 receive enough of a voltage to unintentionally affect storage within their respective floating gates. For example, if it is known that a voltage of 0.8-1V is required to write to the floating gate of a target memory cell, a voltage of 0.5V can be applied to the relevant wordline and 0.5V can be applied to the relevant bitline, such that 1V is supplied to the target memory cell, but only 0.5V is supplied to all of the remaining memory cells, and they remain unaffected. In a similar way, a read operation may be implemented by applying a read threshold voltage to the wordline and testing the conductivity of the cell on the bitline.

This ability to target individual memory cells within a memory device lends itself to RAM applications, due to its speed of selectively addressing individual cells. However, unlike most RAM technologies, the memory device described above is non-volatile. This method of memory access is also advantageous in that it reduces the number of electrical contacts required, since it only requires electrical contact to each bitline and wordline, because the drain terminals of all the cells in the array are connected to each other and to the common base gate terminal. This allows the memory devices to be much more compact relative to other devices with a similar storage capacity.

The invention claimed is:

1. A memory cell for storing one or more bits of information, the memory cell comprising:
   a semiconductor substrate on which is provided a source terminal, a drain terminal, and a channel extending between the source terminal and the drain terminal; and
   a control gate and a floating gate, the floating gate being disposed between the control gate and the channel, and the floating gate being electrically isolated from the control gate and the channel by charge barriers and being configured to enable selective passage of charge carriers into and out of the floating gate, in write and erase operations, to provide at least first and second occupancy states of the floating gate, the channel being arranged to provide a minimum threshold voltage to be applied between the control gate and the semiconductor substrate for introducing charge carriers into the channel from the semiconductor substrate to make the channel conductive, the minimum threshold voltage being dependent on an occupancy state of the floating gate, such that a read voltage may be applied between the control gate and the semiconductor substrate that will provide a conductive channel for the first occupancy state of the floating gate and a non-conductive channel for the second occupancy state of the floating gate, wherein an interface between the channel and the semiconductor substrate is a type-III heterojunction, wherein the channel comprises a quantum well, a quantum dot, or a quantum wire having discrete confined energy levels for accommodating charge carriers in the channel, and wherein a lowest confined energy level of the quantum well, the quantum dot, or the quantum wire in an absence of an electric field applied across the memory cell is at a higher energy than a valence band of the semiconductor substrate.

2. The memory cell according to claim 1, wherein the quantum well, the quantum dot, or the quantum wire is defined between a charge barrier and the semiconductor substrate.

3. The memory cell according to claim 2, wherein the charge barrier and the semiconductor substrate define walls of the quantum well, the quantum dot, or the quantum wire.

4. The memory cell according to claim 1, wherein in an absence of any applied bias across the channel the channel comprises an electric potential barrier at an interface between the channel and a charge barrier, and an electric potential barrier at the interface between the channel and the semiconductor substrate, and wherein the electric potential barrier at the interface between the channel and the semiconductor substrate enables selective passage of charge carriers between the semiconductor substrate and the channel.

5. The memory cell according to claim 4, wherein at least one of:

the selective passage of charge carriers between the semiconductor substrate and the channel, in use, is controllable by controlling at least one of a shape or a magnitude of the electric potential barrier at the interface between the channel and the semiconductor substrate, or the selective passage of charge carriers between the semiconductor substrate and the channel is controllable by application of an electric field across the memory cell.

6. The memory cell according to claim 1, wherein in response to application of an electric field, the lowest confined energy level of the quantum well, the quantum dot, or the quantum wire has a lower energy than a valence band energy of at least a portion of the semiconductor substrate.

7. The memory cell according to claim 1, wherein the channel is formed by having at least one of offset conduction or valence bands to form heterojunctions at an interface between the channel and a charge barrier, and at the interface between the channel and the semiconductor substrate.

8. The memory cell according to claim 1, wherein the channel is formed by a narrow band gap semiconductor being disposed between two wide band gap semiconductors.

9. The memory cell according to claim 1, wherein the channel is formed by indium gallium arsenide (InGaAs), and an adjacent barrier material is gallium antimonide (GaSb).

10. The memory cell according to claim 1, wherein the lowest confined energy level of the quantum well, the quantum dot, or the quantum wire has a higher energy than a Fermi energy of the semiconductor substrate in the absence of an electric field applied across the memory cell.

11. The memory cell according to claim 1, wherein the channel is unoccupied by charge carriers in the absence of an applied electric field.

12. The memory cell according to claim 1, wherein the channel is at least one of non-conductive or insulating in the absence of an applied electric field.

13. A memory device comprising a plurality of memory cells as claimed in claim 1, wherein the floating gate is configured to enable the selective passage of charge carriers into and out of the floating gate by resonant tunnelling, in write and erase operations.

14. The memory device as claimed in claim 13, wherein the plurality of memory cells are arranged in an array comprising a plurality of columns and a plurality of rows, and the memory device comprises at least one first electrical contact arranged to provide a voltage to the control gate of each memory cell in a column of the array, and at least one second electrical contact arranged to provide a voltage to at least one of the source terminal, the drain terminal, or a base gate terminal.

15. The memory device as claimed in claim 14, wherein the first electrical contact is configured to apply a first portion of a required voltage to a desired column within the array, and the second electrical contact is configured to apply a second portion of the required voltage to a desired row within the array, such that a target cell within the array receives a full required voltage.

16. The memory device as claimed in claim 15, wherein the required voltage is any of the read voltage, write voltage and erase voltage.

17. The memory device as claimed in claim 13, wherein either source terminals of a plurality of memory cells or drain terminals of the plurality of memory cells are electrically connected to a base gate terminal that is common to the plurality of memory cells.

\* \* \* \* \*